(12) United States Patent
Zenere

(10) Patent No.: US 9,703,898 B2
(45) Date of Patent: Jul. 11, 2017

(54) METHOD FOR PRODUCING A THREE-DIMENSIONAL OBJECT BY MEANS OF A STEREOLITHOGRAPHY PROCESS, INCLUDING A COMPUTER GRAPHIC DESIGN OF SAID OBJECT

(71) Applicant: DWS, S.R.L., Zane' (VI) Thiene (VI) (IT)

(72) Inventor: Sergio Zenere, Carre' (IT)

(73) Assignee: DWS, S.R.L., Thiene (VI) (IT)

( * ) Notice: Subject to any disclaimer, the term of this patent is extended or adjusted under 35 U.S.C. 154(b) by 695 days.

(21) Appl. No.: 14/354,052

(22) PCT Filed: Nov. 20, 2012

(86) PCT No.: PCT/IB2012/002406
§ 371 (c)(1),
(2) Date: Apr. 24, 2014

(87) PCT Pub. No.: WO2013/076549
PCT Pub. Date: May 30, 2013

(65) Prior Publication Data
US 2014/0316549 A1    Oct. 23, 2014

(30) Foreign Application Priority Data

Nov. 23, 2011   (IT) ............................... VI2011A0302

(51) Int. Cl.
*G06F 19/00* (2011.01)
*G06F 17/50* (2006.01)
*B29C 67/00* (2017.01)

(52) U.S. Cl.
CPC .......... *G06F 17/50* (2013.01); *B29C 67/0088* (2013.01); *B29C 67/0092* (2013.01); *B29C 67/0051* (2013.01)

(58) Field of Classification Search
None
See application file for complete search history.

(56) References Cited

U.S. PATENT DOCUMENTS 8,915,620 B2 * 12/2014 Vaes ..................... B29C 67/007
                                                  257/99
2009/0072447 A1   3/2009 Hull et al.
(Continued)

FOREIGN PATENT DOCUMENTS

FR    1229560 A    9/1960
GB    2 089 284 A  6/1982

OTHER PUBLICATIONS

International Search Report and Written Opinion dated Apr. 4, 2013, issued in PCT Application No. PCT/IB2012/002406, filed Nov. 20, 2012.

*Primary Examiner* — Evral E Bodden
(74) *Attorney, Agent, or Firm* — Husch Blackwell LLP

(57) ABSTRACT

A three-dimensional object (1) made by way of a stereolithography process, includes a plurality of supports (3) that are connected to the body (2) of the object through joining elements (4) in each one of which it is possible to identify a shaped area (5), recessed with respect to the external surface of the joining element (4) and having the bottom corner (6) that delimits a pre-established fracture area (7) for the detachment of the support (3). Each one of the joining elements (4) includes a first body (8) projecting from the external surface that delimits the body (2) of the object and a second body (9) projecting from the support (3), the bodies (8) and (9) being connected to each other so as to define the shaped area (5) whose bottom corner (6) delimits the pre-established fracture area (7). Each one of the bodies (8, 9) has its convex curved external surface that constitutes part of the external surface of a sphere or an ellipsoid.

11 Claims, 5 Drawing Sheets

(56) References Cited

U.S. PATENT DOCUMENTS

| | | | |
|---|---|---|---|
| 2010/0025869 A1 | 2/2010 | Suzuishi et al. | |
| 2015/0183168 A1* | 7/2015 | Liverman | B29C 67/0088 264/401 |
| 2015/0238290 A1* | 8/2015 | Wouters | A61C 13/0004 700/98 |
| 2015/0245890 A1* | 9/2015 | Wouters | A63B 71/085 700/98 |
| 2016/0332386 A1* | 11/2016 | Kuijpers | B29C 67/007 |
| 2017/0001377 A1* | 1/2017 | Meisner | B29C 67/0088 |

* cited by examiner

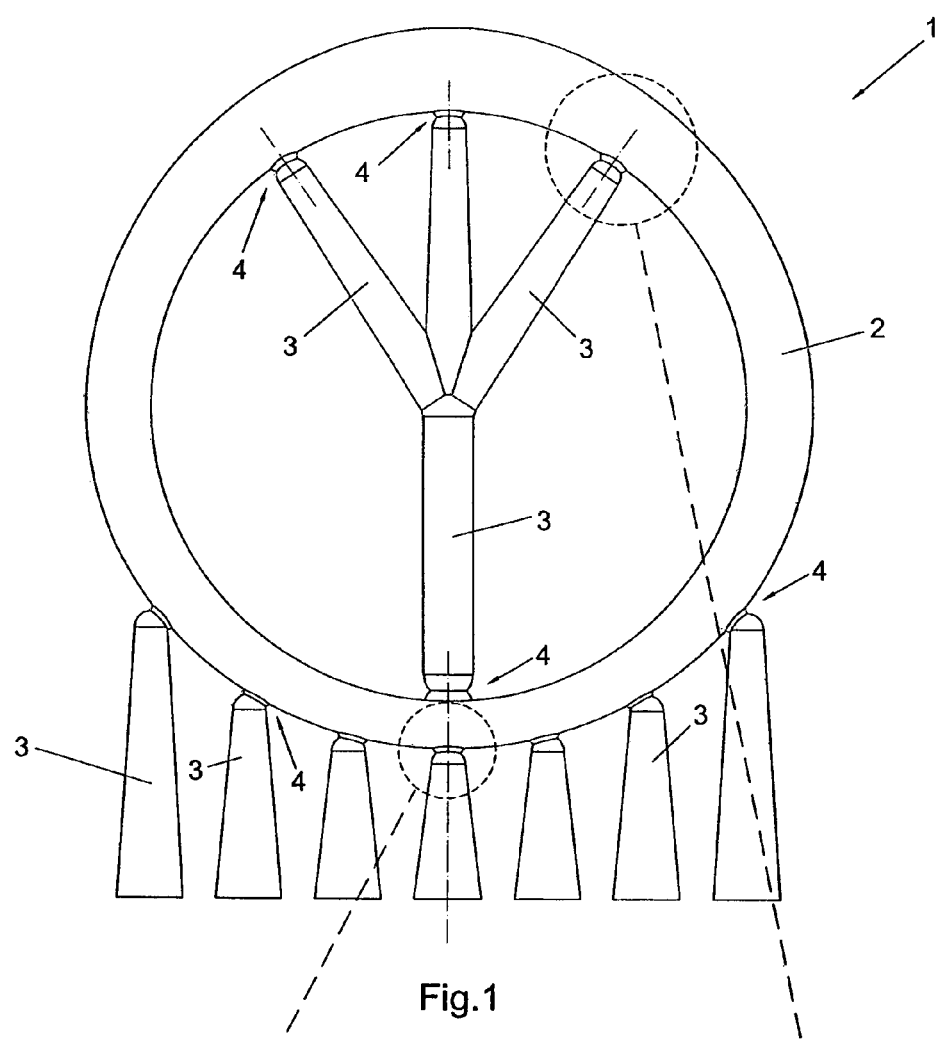
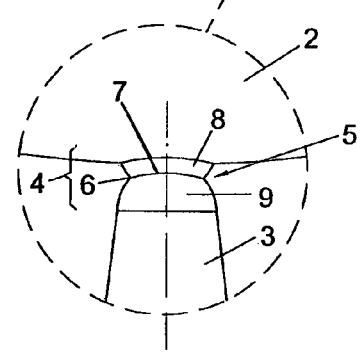
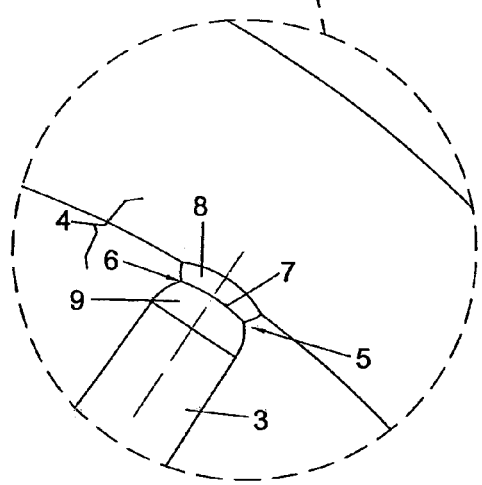
Fig.1
Fig.2
Fig.3

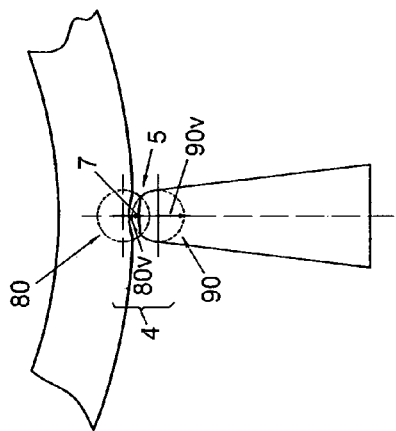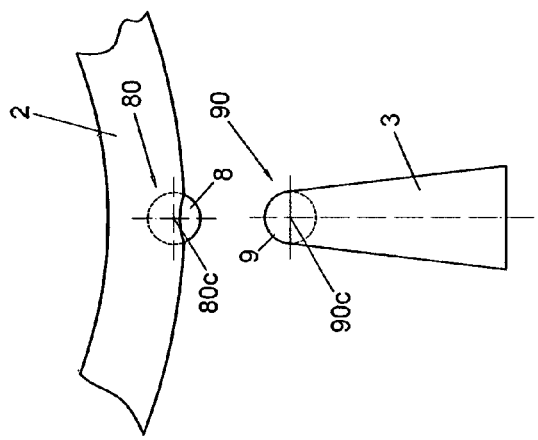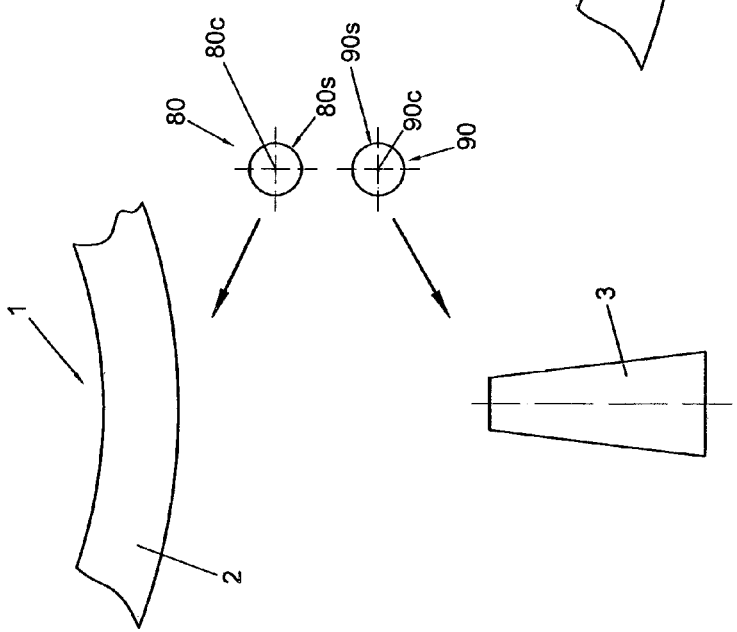

METHOD FOR PRODUCING A THREE-DIMENSIONAL OBJECT BY MEANS OF A STEREOLITHOGRAPHY PROCESS, INCLUDING A COMPUTER GRAPHIC DESIGN OF SAID OBJECT

BACKGROUND OF THE INVENTION

1. Field of the Invention

The invention concerns a method for producing a three-dimensional object by means of a stereolithographic process, including the computer graphic design of the object and in particular of the joining elements of the supports that connect the different parts of the object with each other.

The invention concerns also a method for the computer graphic design of the object and in particular of said joining elements.

It is known that stereolithography is a technique that allows three-dimensional objects to be made starting directly from digital data processed by a CAD/CAM software.

2. Present State of the Art

Stereolithography is used mainly to make prototypes, as it makes it possible to obtain, in a short time, three-dimensional objects, even with a complex structure, which can be analysed and tested before proceeding to the industrial production stage.

For this purpose, the stereolithography process is widely used to make the models of objects that will be successively produced through investment casting.

The stereolithography process substantially produces three-dimensional objects through the superimposition of a plurality of layers with thickness in the order of tenths of micrometers, which are obtained by exposing a liquid resin that polymerises in the presence of light to selective light stimulation in the areas corresponding to the volume of the object to be produced.

The market offers a plurality of types of stereolithography machines, among which, for example, there are stereolithography machines substantially comprising a tank suited to contain the liquid resin and delimited by a transparent bottom and by a modelling head.

The modelling head is positioned on top of the tank and is provided with a plane surface suited to support the three-dimensional object being formed and power means that move the plane surface with respect to the bottom of the tank.

At the beginning of the object formation process the plane surface is immersed in the liquid resin until it comes to be positioned at a distance from the bottom that is equal to the thickness of the first layer to be obtained.

The resin layer included between the bottom of the tank and the plane surface of the modelling head is selectively exposed to a laser beam coming from a laser light emitter arranged under the bottom of the tank and associated with a Cartesian coordinate robot.

The resin is thus exposed to electromagnetic radiation only in the areas corresponding to the volume of the object to be made and during solidification it adheres to the plane surface of the modelling head.

Once the solidification process has been completed, the head is lifted together with the first layer of the object that adheres to it, in order to allow the level of the resin to be restored inside the tank.

Once the resin level has been restored, the head is immersed again in the resin and the operations described above are repeated in order to deposit a second layer that will adhere to the first one and so on, until the object to be made has been completed.

If the object includes portions that project from or are undercut in the base and that may yield or bend, during the object formation process special columns, commonly called supports, are created to support said projecting or undercut portions, wherein said supports constitute an integral part of the object and are removed once the latter has been completed.

According to the known technique, the removal of the supports, a large number of which may be present in particularly complex objects, is performed manually by means of a cutter and poses several acknowledged drawbacks.

If the object is used as a model to obtain parts that are cast by means of the investment casting technique, the manual removal of the supports from the model cannot guarantee a constant high quality of the finished piece.

In fact, if the removal of the supports is performed by cutting them in a position that is excessively spaced from the surface of the model, once the metal has solidified, corresponding projecting stumps that must be removed through mechanical processing will be present on the part that is successively produced through investment casting.

If, on the other hand, the supports are removed by cutting them at the level of the surface of the model, the cutter blades, as is known, in any case create a recess in the body of the model and in each cutting point, so that a void area that must be properly filled will correspond to said recess in the solidified metal part.

It can thus be understood that in practice the impossibility for the operator of cutting manually, in the same way, all the supports present in the model means that projections and hollows distributed at random will be present on the finished piece.

Therefore it can be noticed that it is practically impossible to make cast pieces having all the same quality.

Another drawback lies in that since the cutting of the supports depends only on the ability of the operator in maneuvering the cutter, execution times and costs are rather high.

A further drawback is represented by the fact that with the same resistant section the cutting stress that is necessary to cut each support varies as the type of material with which the support is made varies.

Thus, in order to make supports that can be cut with efforts having a constant value or a value that can be determined by the operator, it would be necessary to design and make them with different cross sections depending on the type of material used.

According to the state of the art, a method is known that is used to make supports for three-dimensional objects by means of a stereolithography process and that is described in the patent document US 2009/0072447 A1.

The indications given in said patent document are intended for the design of the sections of the supports that bear the three-dimensional object during its formation process.

More particularly, the indications contained in the patent document are limited to the definition of a method suited to determine the optimal geometry of the supports so that they are sufficiently resistant to support the three-dimensional object being formed.

The above mentioned patent document, therefore, does not contain indications useful to design and define in an analytical manner the geometry of the joining elements that connect the supports to the three-dimensional body, and thus the indications contained in the above mentioned patent document do not make it possible to overcome the drawbacks of the known art that have been described above.

SUMMARY OF THE INVENTION

The present invention intends to overcome all the drawbacks described above. It is an object of the invention to provide a method for producing a three-dimensional object by means of a stereolithography process, including a computer graphic design of the three-dimensional object wherein the three-dimensional object obtainable by this method is provided with supports for the projecting parts that can be removed in an easy and quick manner, with no need to use tools to cut them in proximity to the area of connection to the body of the object to which they belong.

It is another object of the invention to ensure that in the connection area between each support and the body of the object there is a pre-established fracture area suited to facilitate the detachment of the supports.

It is a further object of the invention to ensure that in the connection area between each support and the body of the object, after detachment, a projecting body having an exactly defined length remains adherent to the object.

It is another object of the invention to ensure that the position, the dimensions and the shape of the pre-established fracture area and the length of the body projecting from the object can be determined in advance during the computer graphic design of the object itself.

It is a further object of the invention to reduce the time and the costs necessary for the removal of the supports compared to the known art.

It is another object of the invention to improve, compared to the known art, the quality of the three-dimensional object after the removal of the supports.

It is a further object of the invention to reduce the design costs of three-dimensional objects compared to the known art.

It is another yet not the least object of the invention to provide a method for the computer graphic design of the three-dimensional object that is the subject of the invention.

According to the embodiment of the invention that is described here below, in the three-dimensional object obtainable by the method according to the invention each support is connected to the body of the three-dimensional object by means of a joining element provided with a pre-established fracture area suited to ensure the detachment of the support.

The invention defines a method implementing a computer graphic design using solid elements with convex curved surface that compenetrate the three-dimensional object, the supports and consequently each other.

The design method makes it possible to program the geometry and the quality and resistance characteristics of each joining element, as will be explained in greater detail below.

In particular, the dimensions and the shape of each joining element are defined independently of the dimensions of the supports and of the shape and position of the surface of the three-dimensional object to which they are connected.

Advantageously, according to the invention, the designer can design the shape and size of the joining element of each one of the supports and the supports themselves according to his/her own needs and to the characteristics of the material, so that the supports can be removed in an easier, quicker and less expensive manner than in the known art.

Still advantageously, the designer can design and plan the object with the joining elements of each one of the supports and represent it without the latter. In this way, the designer can display the object without the presence of the supports, which, on the other hand, cannot be done in the known art.

Furthermore, advantageously, said possibility to design the shape and size of the joining element makes it also possible to define also the degree of quality of the object.

Still advantageously, the removal of the supports can be performed manually, without using cutting instruments like, for example, cutters or similar cutting tools.

Furthermore, advantageously, the presence of the joining element with the corresponding pre-established fracture area makes it also possible to position the cutter or similar cutting tools safely in the case where the joining element has such dimensions that the support cannot be detached and removed manually.

BRIEF DESCRIPTION OF THE DRAWINGS

The objects and advantages of the invention mentioned above are described in greater detail here below, making reference to a preferred embodiment of the invention that is provided by way of non-limiting example with reference to the attached drawings, wherein:

FIG. 1 shows a schematic view of the improved three-dimensional object obtainable by the method according to the invention;

FIGS. 2 and 3 show details of FIG. 1;

Figure 7:
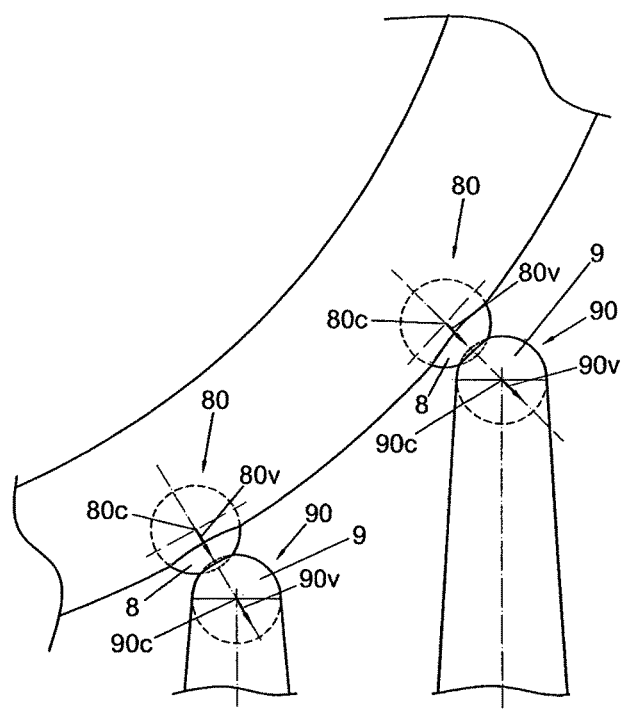

FIGS. from 4 to 6 show different stages of the design of the object of the invention;

FIGS. from 7 to 12 show details of the object shown in FIG. 1.

DETAILED DESCRIPTION OF THE PREFERRED EMBODIMENTS

The three-dimensional object obtainable by the method according to the invention is shown in an overall schematic view in FIG. 1, where it is indicated by 1.

It can be observed that it comprises an annular body 2 substantially circular in shape, provided with a plurality of supports 3 connected to it internally and externally.

It is important to point out that the three-dimensional object illustrated is shown as a mere example of any three-dimensional object obtained by means of a stereolithography process and provided with a plurality of supports that hold its parts during the formation process.

Furthermore, the annular body 2 of the three-dimensional object 1 constitutes the desired model.

The decision to make reference to the three-dimensional object 1 shown in the figures has thus been made only for the sake of simplicity of description and illustration, since the explanation provided here below can be referred to any three-dimensional object in any shape and size obtained by means of a stereolithography process.

As already explained, during the formation of the object the supports 3 are generated which, as shown in FIG. 1, are connected to the object by means of joining elements, each one of which is indicated as a whole by 4.

According to the invention, in each one of the joining elements 4 it is possible to identify a shaped area 5, recessed with respect to the external surface of the joining element 4, having its bottom corner 6 that delimits a pre-established fracture area 7 for the detachment of the joining element 4.

In particular, with reference also to FIGS. 2 and 3, each one of the joining elements 4 comprises a first body 8 projecting from the external surface that delimits the body 2 of the three-dimensional object 1 and a second body 9 projecting from the support 3, said bodies 8 and 9 being connected to each other in such a way as to define the shaped area 5 whose bottom corner 6 delimits said pre-established fracture area 7.

Said pre-established fracture area 7 thus defines a resistant section whose surface area depends on the length of the perimeter of the bottom corner 6.

Therefore, the presence of the pre-established fracture area 7 makes it possible to separate each joining element 4 from the body 2 of the object 1 in a clearly defined point, in a simple and quick manner and, above all, with no need to intervene with cutting tools like, for example, shears or cutters.

Furthermore, the presence of the pre-established fracture area 7 defines a precise area in which it is possible to put the cutter or other cutting tools if, due to the excessive dimensions of the joining element 4, the separation of the corresponding support cannot be performed manually.

In this way, however, it is guaranteed that the separation of the support 3 takes place always in the same position, with no damage to the body 2 of the three-dimensional object 1 and/or preventing any excessively long portion of the first body 8 from projecting from the body 2.

It is also possible to choose the position of the first body 8 with respect to the body 2 of the object 1 and of the first body 8 with respect to the second body 9 in such a way as to define the position of the pre-established fracture area 7 and the surface area of the resistant section of said pre-established fracture area 7.

This makes it possible to size said surface area according to the fragility of the material with which the supports 3 are made, in order to favour their detachment while at the same time guaranteeing the mechanical resistance that allows them to serve their supporting function.

Furthermore, the definition of the position of the first body 8 with respect to the body 2 of the object 1 and of the second body 9 with respect to the first body 8 determines the length of the portion of the first body 8 that after removal of the support 3 remains projecting from the body 2.

The designer can thus choose these positions so that after the removal of the support 3 the length of the portion of the first body 8 that projects from the body 2 of the object 1 is not such as to affect the quality of the external surface of the object.

As regards the shape of said bodies 8 and 9, each one of them has the convex curved external surface that may be part of the external surface of a sphere, as shown in Figures from 1 to 3.

According to another embodiment of the invention, the convex curved external surface of each one of the bodies 8 and 9 can be part of the external surface of an ellipsoid that is not illustrated in the figures in order to simplify the drawings.

In a further embodiment of the invention the convex curved external surface of the first body 8 can be part of the external surface of a sphere, while the convex curved external surface of the second body 9 can be part of the external surface of an ellipsoid, and vice versa.

The decision to make the bodies 8 and 9 that make up each joining element 4 with spherical or ellipsoidal external surface simplifies the design operations and makes them quicker.

The method for the computer graphic design of the joining elements 4 of the supports 3 of a three-dimensional object 1 made by means of a stereolithography process according to the invention comprises a series of operations that are listed and explained in detail with reference to Figures from 4 to 6.

First of all, using any CAD/CAM software available on the market it is possible to make a drawing of the three-dimensional object 1, a part of whose body 2 is shown in Figures from 4 to 6, said part regarding the area where the joining element 4 is provided.

Then a first element 80 is designed, defined by at least one centre 80$c$ and by a convex curved external surface 80$s$ and intersecting the body 2 of the three-dimensional object 1 in such a way as to define a portion of the first element 80 that projects from the body 2, as shown in FIG. 5.

Figure 8:
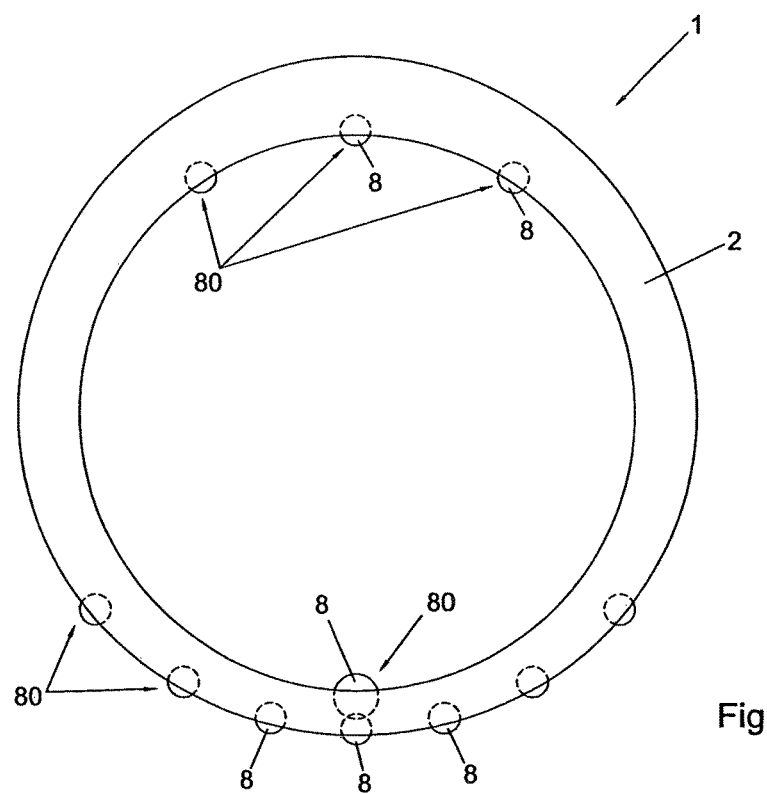

Advantageously, this allows better observation of the body 2 of the three-dimensional object 1 with all the first bodies 8 projecting from the body 2 itself according to the configuration shown in FIG. 8, without the supports 3.

Then, a second element 90 is designed at one end of each one of the supports 3, said second element being defined, too, by at least one centre 90$c$ and a convex curved external surface 90$s$, as can be observed always in FIG. 5.

At this point said second element 90 is intersected with the portion of the first element 80 that projects from the body 2 of the three-dimensional object 1, as shown in FIG. 6, so as to define the joining element 4.

In FIG. 6 the intersection of the second element 90 with the portion of the first element 80 that projects from the three-dimensional object 1 defines the shaped area 5 and the corresponding pre-established fracture area 7.

In this way, the portion of the first element 80 included between the pre-established fracture area 7 and the body 2 of the three-dimensional object defines the first body 8 while the portion of the second element 90 included between the pre-established fracture area 7 and the support 3 defines the second body 9.

The first element 80 and the second element 90 can both be spheres, or can both be ellipsoids, or one of them can be a sphere and the other an ellipsoid, so that each of the elements 8 and 9 that derive from them and project respectively from the body 2 of the object 1 and from the support 3 has its convex curved external surface constituted by part of the curved surface of said solids.

The decision to make the elements 80 and 90 with spherical or ellipsoidal surfaces offers considerable advantages to the operator who makes the design, both in terms of simplification of the generation of the surfaces making up said elements and in terms of ease of control of the intersections between said surfaces.

It is known, in fact, that in computer graphic design a surface is defined by a plurality of triangles, each one of which is represented by a versor applied at its centre.

Thus, to represent a surface it is necessary to use a plurality of versors, each one of which corresponds to one of the triangles that define it.

In order to align two surfaces with each other, the computer graphic design software is forced to process a huge quantity of data that increases as said surfaces become more complex.

All this means long data processing times and long design execution times.

If, on the contrary, according to the invention, for the computer graphic design spherical or ellipsoidal elements are used which, as is known from solid geometry, are single-surface elements provided with a centre, each one of said surfaces can be identified by a single versor applied at the centre of the element.

This allows a whole series of advantages to be obtained.

First of all, the operator's job is greatly simplified, in fact when two elements 80 and 90 are placed in contact with each other, independently of their position, their centres 80*c* and 90*c* are always aligned along the same alignment direction of the versors 80*v* and 90*v* that define their respective surfaces, as shown in FIGS. 6 and 7.

Furthermore, said alignment takes place when said elements are both spherical or both ellipsoidal as well as when one of them is spherical and the other is ellipsoidal.

Furthermore, said design work is much quicker because the software requires shorter processing times.

According to Euclidean geometry, the pre-established fracture area 7 generated by the intersection between the elements 80 and 90 is thus a plane that is always orthogonal to the direction defined by the alignment of the versors 80*v* and 90*v* and always parallel to a respective plane that is tangential to the body 2 of the three-dimensional object 1 at the point of intersection of the body 2 with said direction of alignment of the versors 80*v* and 90*v*.

Advantageously, this contributes to making the external surface of the body 2 of the three-dimensional object 1 homogeneous after the removal of the supports 3.

The decision to make the elements 80 and 90 spherical or ellipsoidal offers also the advantage of defining in a univocal manner the point where, in terms of software, the element 80 must be cut if it should project from one side of the body 2 where there is no support 3.

In this case, in fact, the orthogonality of the versor 80*v* with respect to the area of intersection of the element 80 with the external surface of the body 2 defines the cutting point exactly and in a univocal manner.

The same operation, on the other hand, would be much more complex if the element 80 had its external surface in a shape different from the spherical or ellipsoidal shape.

Finally, it is possible to program the control of the position of intersection between the elements 80 and 90 to define the pre-established fracture area 7 and thus the position and surface area of the resistant section corresponding to it.

Said surface area, in fact, can be easily determined through the known mechanical resistance equations that can be integrated in the design generation software.

This consequently simplifies and speeds up also the job necessary to determine the lengths of the bodies 8 and 9 projecting from the body 2 of the object 1 that can advantageously be displayed so that the operator can check them, as shown in FIG. 8, immediately after carrying out the intersection of each first element 80 with the body 2 shown in FIG. 5.

After carrying out the intersection between the elements 80 and 90 that can be observed in FIG. 6, the values of the distances of the centres 80*c* and 90*c* from each other and from the external surface of the body 2 of the three-dimensional object 1 are defined and then the elements and the supports are designed in the configurations thus achieved based on said defined values of the distances.

It is possible to define different configurations to be selected by the designer, some of which are described by way of example in the Figures from 9 to 12.

With reference to Figures from 9 to 11, it is possible to observe three different configurations, in each one of which the pre-established fracture area 7 of the joining element 4 has always the same surface area that is indicated by S1 as the centres 80*c* and 90*c* of the respective elements 80 and 90 that define it are arranged at the same distance X1.

Figure 9:
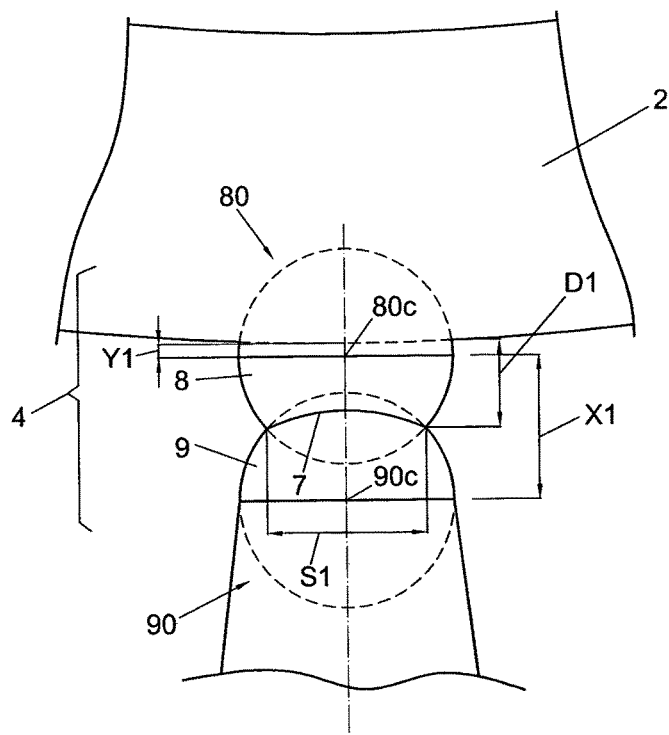
Figure 10:
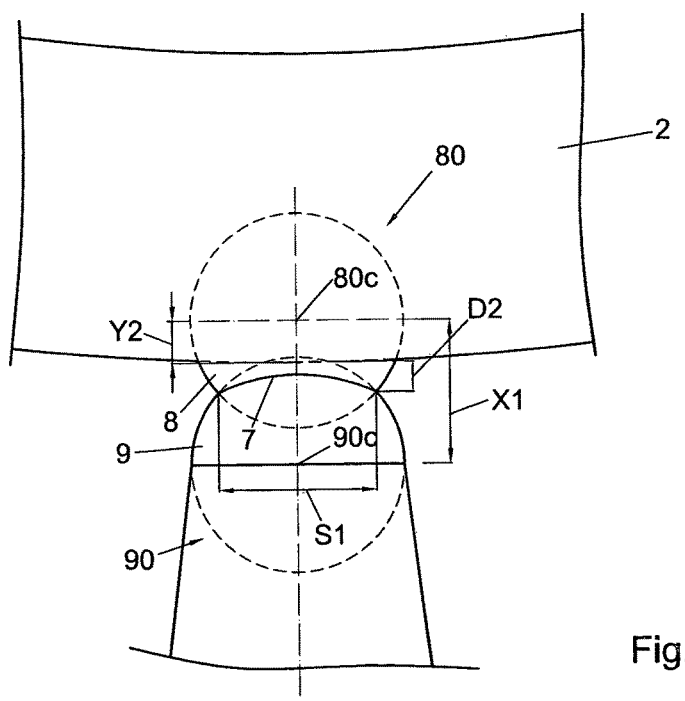
Figure 11:
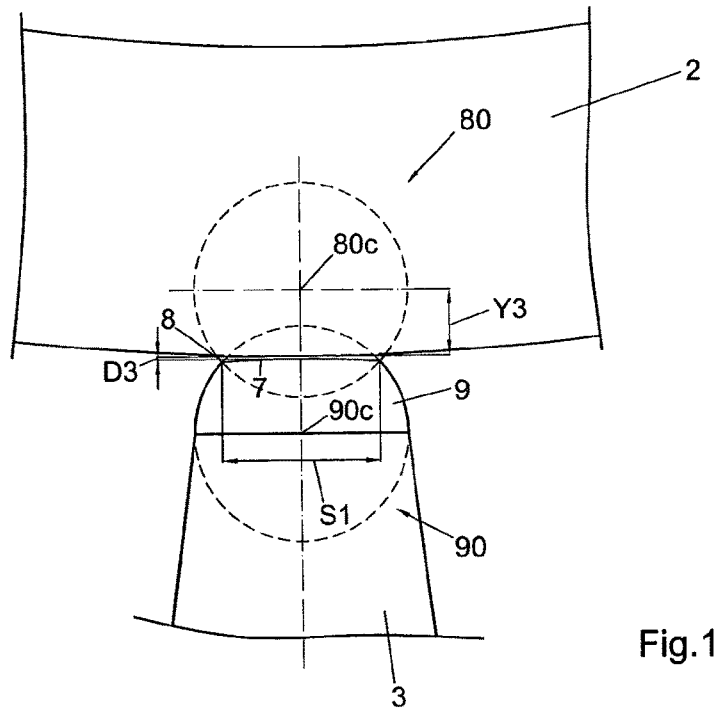

Vice versa, the centre 80*c* of the first element 80 is arranged in different positions and at different distances Y1, Y2 and Y3 with respect to the surface of the body 2 of the object 1, as shown in FIGS. 9, 10 and 11, respectively.

This means that, once the support 3 has been removed, each respective first body 8 will be projecting from the surface of the body 2 of the object 1 by different quantities D1, D2 and D3, progressively decreasing from FIG. 9 to FIG. 11.

Figure 12:
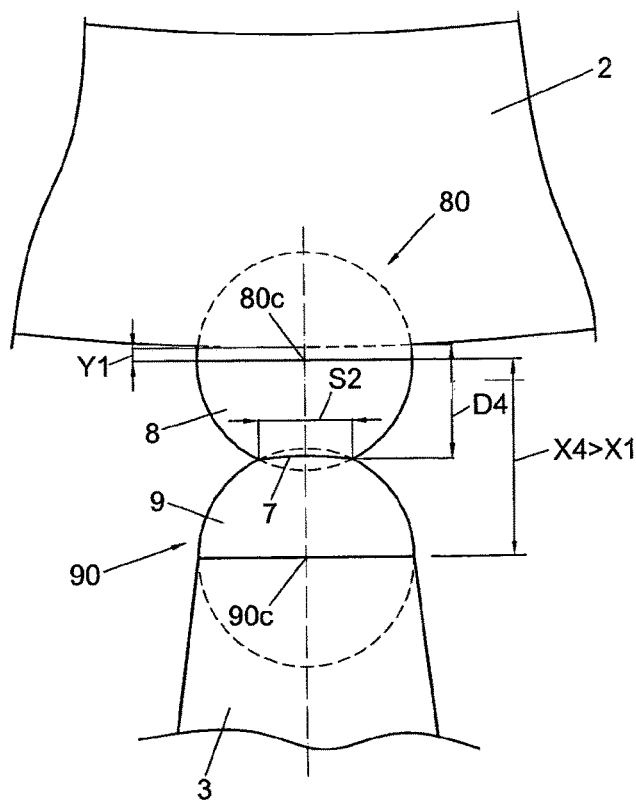

With reference to FIG. 12, it is possible to observe a further configuration, in which the centre 80*c* of the first element 80 is arranged at the same distance Y1 from the surface of the body 2 of the object 1 that can be observed in the configuration of FIG. 9, but the centres 80*c* and 90*c* of the elements 80 and 90 are arranged at a distance X4 that is longer than the distance X1.

This means, as can be observed in FIG. 12, a lower value S2 of the surface area of the resistant section of the pre-established fracture area 7 and a higher value D4 of the projection of the first body 8 after the removal of the support 3.

The examples shown in the Figures from 9 to 12 refer to spherical elements 80 and 90 but these elements may also be ellipsoidal.

It can thus be understood that the design of the joining element 4 with spherical or ellipsoidal elements makes it possible to size precisely, in a simple and quick manner, the configuration of the resistant section, in such a way as to adapt the efforts necessary to detach the supports 3 according to the user's needs and to the type of material with which said supports are made.

Furthermore, it is also possible to define the protrusions of the same elements according to the quality of the object.

Based on the above explanation, it can be understood that the invention achieves all the set objects.

In particular, it achieves the object to allow the removal of the supports from the body of the object to be carried out in a simple and quick manner, with no need to use tools to cut them in proximity to the areas of connection to the body of the object to which they belong.

Furthermore, it is possible to define a joining element in the connection area of each support to the body of the object, said joining element being provided with a pre-established fracture area whose size can be changed as desired by the designer, in such a way as to adapt the breaking effort to the type of material with which the three-dimensional object is made.

In addition to the above, it is possible to define the length of the areas projecting from the object that remain adherent to it after the supports have been removed, so that it is possible to know in advance and plan the quality of the three-dimensional object that is going to be produced.

These options are possible thanks to the use of the computer graphic design method described above, which also makes it possible to design automatically the joining elements of each support of the three-dimensional object with the desired dimensional characteristics described above, if the equations related to the resistance criteria chosen according to the material are integrated in the design generation software.

In the construction stage, the three-dimensional object and the method for its design can be subjected to variants and modifications that are neither described in this text nor illustrated in the attached drawings.

It is understood, however, that said variants or modifications, if any, must all be considered protected by the present patent, provided that they fall within the scope of the claims that follow.

Where technical features mentioned in any claim are followed by reference signs, those reference signs have been included for the sole purpose of increasing the intelligibility of the claims and accordingly such reference signs do not have any limiting effect on the protection of each element identified by way of example by such reference signs.

The invention claimed is:

1. Method for producing a three-dimensional object which comprises a plurality of supports that are connected to the body of said object by joining elements in each one of which it is possible to identify a shaped area, recessed with respect to the external surface of said joining element and having a bottom corner that delimits a pre-established fracture area for the detachment of said support, wherein each one of said joining elements comprises a first body projecting from the external surface that delimits the body of said object and a second body projecting from said support, said first and said second body having the external surface that is curved and convex and being connected to each other in such a way as to define said shaped area whose bottom corner delimits said pre-established fracture area by means of a stereolithography process, including the computer graphic design of the joining elements of the supports to its body comprising the following operations:

designing the body of said three-dimensional object and a plurality of supports;

designing a plurality of first elements, each defined by at least one centre and one convex curved external surface;

intersecting said first elements with the body of said three-dimensional object in such a way as to define for each one of said first elements a portion projecting from the body of said three-dimensional object;

designing at one end of each one of said supports a second element defined at least by one centre and by one convex curved external surface;

applying to the centre of each one of said elements the versor that defines its convex curved external surface;

aligning with each other said versors of each pair of said elements;

intersecting said second element with said portion of said first element projecting from the body of said three-dimensional object;

defining the values of the distances of said centres of said elements from each other and with respect to the external surface of the body of said three-dimensional object;

designing said elements and said supports in the configurations reached according to said defined values of the distances so as to define said shaped area whose bottom corner delimits said pre-established fracture area.

2. Method according to claim 1, wherein the portion of said first element included between the external surface of the body of said three-dimensional object and said pre-established fracture area defines said first projecting body.

3. Method according to claim 1, wherein said portion of said second element included between said end of said support and said pre-established fracture area defines said second projecting body.

4. Method according to claim 2, wherein said first element and said second element are spheres.

5. Method according to claim 2, wherein said first element and said second element are ellipsoids.

6. Method according to claim 2, wherein said first element is a sphere and said second element is an ellipsoid.

7. Method according to claim 2, wherein said first element is an ellipsoid and said second element is a sphere.

8. Method according to claim 3, wherein said first element and said second element are spheres.

9. Method according to claim 3, wherein said first element and said second element are ellipsoids.

10. Method according to claim 3, wherein said first element is a sphere and said second element is an ellipsoid.

11. Method according to claim 3, wherein said first element is an ellipsoid and said second element is a sphere.

* * * * *